US011536990B2

(12) United States Patent
Guermandi

(10) Patent No.: US 11,536,990 B2
(45) Date of Patent: Dec. 27, 2022

(54) DRIVER CIRCUIT FOR DRIVING A VOLTAGE CONTROLLED ELECTRO-OPTICAL MODULATOR

(71) Applicant: IMEC VZW, Leuven (BE)

(72) Inventor: Davide Guermandi, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/399,206

(22) Filed: Aug. 11, 2021

(65) Prior Publication Data
US 2022/0066243 A1 Mar. 3, 2022

(30) Foreign Application Priority Data

Sep. 2, 2020 (EP) ..................................... 20194006

(51) Int. Cl.
*H03K 19/0175* (2006.01)
*G02F 1/01* (2006.01)
*H03K 17/22* (2006.01)

(52) U.S. Cl.
CPC ......... *G02F 1/0123* (2013.01); *H03K 17/223* (2013.01)

(58) Field of Classification Search
None
See application file for complete search history.

(56) References Cited

U.S. PATENT DOCUMENTS 6,002,269 A 12/1999 Dartnell et al.
7,034,571 B2 * 4/2006 Tobita ............... H03K 19/01714
327/333
11,031,865 B2 * 6/2021 Rana ..................... H02M 3/073
2003/0234969 A1 12/2003 Bostak et al.
2004/0257111 A1 12/2004 Tobita
2014/0333365 A1 11/2014 Takahashi
2022/0158552 A1 * 5/2022 Rana ..................... H02M 3/076

FOREIGN PATENT DOCUMENTS

CN 106251808 B 7/2018

OTHER PUBLICATIONS

Extended European Search Report and Written Opinion, Application No. EP20194006.1, dated Feb. 8, 2021, 9 pages.
(Continued)

*Primary Examiner* — Jeffery S Zweizig
(74) *Attorney, Agent, or Firm* — McDonnell Boehnen Hulbert & Berghoff LLP

(57) ABSTRACT

Examples include a driver circuit for driving a voltage controlled electro-optical modulator. The driver circuit includes a supply input and an input for receiving the input voltage. The driving circuit further includes a level shifter circuit, which includes first and second capacitors and is electrically connected to the input, and a voltage distribution circuit, which is electrically connected between the level shifter circuit and an output of the driver circuit for providing the output voltage. The level shifter circuit is configured to generate, based on the input voltage and using the first capacitor, a first voltage varying between the positive supply voltage level and a positive first level that is greater than the positive supply voltage level. The level shifter circuit is also configured to generate, based on the input voltage and using the second capacitor, a second voltage varying between ground and a negative second level.

20 Claims, 8 Drawing Sheets

(56) References Cited

OTHER PUBLICATIONS

Rakowski, Michal, Julien Ryckaert, Marianna Pantouvaki, Hui Yu, Wim Bogaerts, Kristin De Meyer, Michiel Steyaert, Philippe P. Absil, and Joris Van Campenhout. "Low-Power, 10-Gbps 1.5-Vpp differential CMOS driver for a silicon electro-optic ring modulator." In Proceedings of the IEEE 2012 Custom Integrated Circuits Conference, pp. 1-6. IEEE, 2012.

Rakowski, Michal, Marianna Pantouvaki, Hui Yu, Wim Bogaerts, Kristin De Meyer, Michiel Steyaert, Bradley Snyder et al. "Low-power, low-penalty, flip-chip integrated, 10gb/s ring-based 1v cmos photonics transmitter." In 2013 Optical Fiber Communication Conference and Exposition and the National Fiber Optic Engineers Conference (OFC/NFOEC), pp. 1-3. IEEE, 2013.

Li, Hao, Zhe Xuan, Alex Titriku, Cheng Li, Kunzhi Yu, Binhao Wang, Ayman Shafik et al. "A 25Gb/s 4.4 V-swing AC-coupled Si-photonic microring transmitter with 2-tap asymmetric FFE and dynamic thermal tuning in 65nm CMOS." In 2015 IEEE International Solid-State Circuits Conference—(ISSCC) Digest of Technical Papers, pp. 1-3. IEEE, 2015.

Saeedi, Saman, and Azita Emami. "A 10Gb/s, 342fJ/bit micro-ring modulator transmitter with switched-capacitor pre-emphasis and monolithic temperature sensor in 65nm CMOS." In 2016 IEEE Symposium on VLSI Circuits (VLSI-Circuits), pp. 1-2. IEEE, 2016.

* cited by examiner

DRIVER CIRCUIT FOR DRIVING A VOLTAGE CONTROLLED ELECTRO-OPTICAL MODULATOR

CROSS-REFERENCE TO RELATED APPLICATIONS

The present application is a non-provisional patent application claiming priority to European Patent Application No. 20194006.1, filed on Sep. 2, 2020 the contents of which are hereby incorporated by reference.

FIELD OF THE DISCLOSURE

The present disclosure relates to a driver circuit for driving a voltage controlled electro-optical modulator and to a system comprising such a driver circuit and a voltage controlled electro-optical modulator.

BACKGROUND

A voltage controlled electro-optical modulator is an optical intensity modulator. An example of a voltage controlled electro-optical modulator is a ring modulator (RM), in particular a silicon RM. Ring modulators (RMs) are used in optical communication to modulate a continuous laser light and encode in non-return to zero format (NRZ, also called PAM2) the binary information to be optically transmitted.

SUMMARY

Without discussing RM physics in detail, an RM is an optical resonator realized with a PN junction. That is, the RM is an example of an electro-optical modulator that electrically behaves like a diode. The resonance wavelength of the optical resonator and the RM, hence the "transparency" to light at a specific wavelength, depends on the applied voltage to the PN junction. For an RM operating in reverse bias, the anode-cathode voltage (VAK), i.e. the voltage applied to the PN junction, should be lower than the direct forward bias threshold (about 0.6 V for a Silicon RM). The "direct forward bias threshold" may also be referred to as "positive forward voltage level for forward biasing." Because of the reverse bias and the absence of photon-to-electron conversion in the RM, no current flows between anode and cathode of the PN junction with VAK<0.6 V. For modulating light, the RM is operated in reverse bias. An RM and the circuit used to control the VAK of the RM as a function of the data to be transmitted form a transmitter. This circuit may also be referred to as a driver circuit for driving the RM, which is an example of a voltage controlled electro-optical modulator. The data to be optically transmitted are provided to the driver circuit as an electrical digital signal in the form of an input voltage.

By simplification an RM (and in general any voltage controlled electro-optical modulator) may be considered as a black box that works as follows:

When a logical high (logical one) "1" of a bit stream of a digital input signal (data signal) is to be optically transmitted, the RM is configured to let pass as much light as possible. In this condition, the optical output power corresponds to the optical output power P1. The insertion loss (IL) is the light attenuation in this condition.

When a logical low (logical zero) "0" of the bit stream of the digital input signal is to be optically transmitted, the RM is configured to block as much light as possible. In this condition, the optical output power corresponds to the optical output power P0. As a result, the optical output power P0 is smaller than the optical output power P1 (P0<P1). The extinction ratio (ER) is the ratio between the light transmitted in the condition of optically transmitting a logical high "1" and optically transmitting a logical low "0" (ER=P1/P0).

Alternatively, the logical high may be optically transmitted with the optical output power P0 and the logical low may be optically transmitted with the optical output power P1.

For a given laser power at the RM optical input, the maximum Optical Modulated Amplitude (OMA=P1−P0), given by the difference between the optical power for a logical high "1" and logical low "0," is achieved by minimizing IL and maximizing ER. OMA is a key parameter of an optical transmitter because it measures the amplitude of the transmitter signal (optical signal) carrying the binary information. The transmitter penalty TP is equal to two times the input laser power divided by the optical output OMA. A theoretical perfect transmitter that may be totally transparent and totally opaque (IL=1 or 0 dB, ER=infinity or infinity dB), has a TP of 3 dB and its OMA equals its input laser power. Any real implementation will have a higher penalty TP. In general:

$$TP = 2 \cdot IL \cdot \frac{ER}{ER-1}.$$

The terms "greater than" and "higher than" may be used as synonyms. The terms "smaller than," "less than," and "lower than," may be used as synonyms.

Since the RM resonance (and therefore the transparency of the RM to the laser light at a proper wavelength) is a monotonic function of the voltage applied to the RM, a larger applied voltage difference between the voltage applied for optically transmitting the optical output power P0 corresponding to a logical low "0" and the voltage applied for optically transmitting the optical output power P1 corresponding to a logical high "1" results in a higher light difference between the optical output powers P1 and P0, and therefore in a higher OMA.

This is shown in FIG. 6 for three different VAK values VAK1, VAK2 and VAK3. In order for the RM to work in reverse bias, the VAK is generally negative or, if positive, limited to below the forward bias threshold (e.g. 0.6 Volt for a silicon RM) to avoid forward conduction.

State-of-the-art silicon RMs achieve an IL of ≈3 dB and ER ≈3 dB for a voltage swing of VAK of ≈1 Volt. This corresponds to a TP of ≈9 dB. Increasing the applied voltage swing of VAK (i.e. increasing the difference between the voltage applied for optically transmitting the optical output power P0 and the voltage applied for optically transmitting the optical output power P1) results in an increased ER, and therefore a lower TP and a higher OMA for the same laser power. This is shown in FIG. 6.

On the left side of FIG. 6, when applying the voltage value VAK1 the laser light at the laser wavelength is modulated such that the optical output power P0 is transmitted for optically transmitting e.g. the logical low "0." When applying the voltage value VAK2, which is smaller than the voltage value VAK1 (VAK2<VAK1), the laser light at the laser wavelength is modulated such that the optical output power P1 is transmitted for optically transmitting e.g. the logical high "1." On the right side of FIG. 6, when applying the voltage value VAK1 the laser light at the laser wavelength is modulated such that the optical output power P0 is transmitted for optically transmitting e.g. the logical low "0." When applying the voltage value VAK3, which is smaller than the voltage value VAK2 (VAK3<VAK2), the laser light at the laser wavelength is modulated such that the optical output power P1 is transmitted for optically transmitting e.g. the logical high "1." The terms "voltage level" and "voltage value" may be used as synonyms.

As can be determined on the basis of the two graphs shown in FIG. 6, when the voltage swing of VAK between the voltage value for transmitting P0 (VAK1 for both graphs) and the voltage value for transmitting P1 (left graph: VAK2, right graph: VAK3) is increased, the gap between the two optical output powers P0 and P1 increases. Namely, the gap between the two optical output powers P0 and P1 caused by the voltage swing of VAK between the two values/levels VAK1 and VAK3, shown on the right side, is greater than the gap between the two optical output powers P0 and P1 caused by the voltage swing of VAK between the two values VAK1 and VAK2. An increase in the voltage swing of the VAK thus results in a greater ER, and therefore a smaller TP and a greater OMA for the same laser power.

The voltage swing of VAK across the RM is usually limited by the supply of the driver circuit for driving the RM, which is can be dictated by the technology of choice. Usually this voltage swing corresponds to two times the supply voltage VDD of the driver circuit (2·VDD). For advanced CMOS nodes, the supply voltage VDD is usually lower than 1 Volt (e.g. 0.8 Volt) resulting in a maximum theoretical VAK voltage swing of e.g. 2·VDD=1.6V (from −VDD to +VDD), when both the terminals are toggled in opposite phase. Given, however, that VAK should be lower than the forward bias threshold of e.g. about 0.6 Volt for silicon, the maximum achievable swing might only be VDD+0.6 Volt (e.g. VDD+0.6 Volt=1.4 Volt).

In view of the above-mentioned disadvantages, embodiments of the present disclosure can help increase the voltage swing across the RM beyond the limits imposed by the supply voltage VDD, and therefore to increase the ER, without the need of extra electrical supplies providing additional supply voltages beside the supply voltage VDD, extra control voltages, and extra clocks. Described herein is a driver circuit for driving a voltage controlled electro-optical modulator, e.g. an RM, by providing an output voltage to the modulator according to an input voltage. The driver circuit is configured to increase the voltage swing of the output voltage compared to the voltage swing of the input voltage. In particular, the driver circuit could be configured to increase the voltage swing of the output voltage beyond the limits imposed by the supply voltage VDD without the need of extra electrical supplies providing additional supply voltages beside the supply voltage VDD, extra control voltages, and extra clocks.

A first aspect of the disclosure provides a driver circuit for driving a voltage controlled electro-optical modulator by providing an output voltage to the electro-optical modulator according to an input voltage. The driver circuit comprises a supply input for receiving a DC supply voltage with a positive supply voltage level and an input for receiving the input voltage, wherein the input voltage varies between a low input level and a high input level. The driver circuit further comprises a level shifter circuit, which comprises two capacitors and is electrically connected to the input, and a voltage distribution circuit, which is electrically connected between the level shifter circuit and an output of the driver circuit for providing the output voltage. The level shifter circuit is configured to generate, based on the input voltage and using a first capacitor of the two capacitors, a first voltage varying between the positive supply voltage level and a positive first level that is greater than the positive supply voltage level. In addition, the level shifter circuit is configured to generate, based on the input voltage and using the second capacitor of the two capacitors, a second voltage varying between ground and a negative second level. The voltage distribution circuit is configured to distribute the first voltage and the second voltage to the output such that the output voltage is variable between a positive third level that is equal to or less than the positive supply voltage level and a negative fourth level, wherein the absolute value of the negative fourth level is greater than the absolute value of the positive first level.

The driver circuit according to the first aspect can help increase the voltage swing of the output voltage beyond the limits imposed by the positive supply voltage level of the DC supply voltage. Namely, the output voltage of the driver circuit is variable between the positive third level that is equal to or less than the positive supply voltage level and the negative fourth level. The absolute value of the negative fourth level is greater than the absolute value of the positive first level and, thus, greater than the absolute value of the positive supply voltage level. The driver circuit can potentially achieve the increased voltage swing of the output voltage without additional electrical supplies providing additional supply voltages beside the DC supply voltage receivable by the supply input of the driver circuit, without additional control voltages besides the input voltage receivable at the input of the driver circuit and without extra clocks.

In particular, the absolute value of the negative fourth level may be equal to the sum of the positive first level and the absolute value of the negative second level.

The driver circuit is configured to provide the output voltage without an additional supply voltage, in particular without an additional supply voltage comprising a positive level greater than the positive supply voltage level of the supply voltage receivable at the supply input. That is, the driver circuit is can be electrically operated with the DC supply voltage for shifting the input voltage to the output voltage.

The voltage controlled electro-optical modulator drivable by the driver circuit of the first aspect of the present disclosure may electrically behave as a capacitor or as a diode. In case the modulator electrically behaves as a diode, the output voltage corresponds to an anode-cathode voltage (VAK). Further, in case the modulator electrically behaves like a diode, the electro-optical modulator is configured to electrically operate in reverse bias for modulating a laser light, e.g. continuous laser light. The electro-optical modulator may be an optical ring modulator (optical RM), which electrically behaves as a diode. In case the electro-optical modulator electrically behaves like a capacitor, there are no restrictions on the polarity and magnitude of the output voltage for driving the modulator compared to the case in which the electro-optical modulator electrically behaves like a diode. Namely, in case the electro-optical modulator electrically behaves like a diode, the driver circuit may be configured to limit the positive third level of the output voltage below the positive forward voltage level for forward biasing the electro-optical modulator. This helps the electro-optical modulator (when driven by the driver circuit) to operate in reverse bias and, thus, to be configured to modulate light, such as laser light.

In particular, the two capacitors of the level shifter circuit are bootstrap capacitors.

The input voltage may be a toggling voltage, e.g. a toggling signal, that toggles between the low input level and the high input level. In case the input voltage is a toggling voltage, the output voltage is also a toggling voltage that toggles between the positive third level and the negative fourth level. Moreover, the input voltage may be a digital signal, e.g. a binary digital signal. In particular, the input voltage may be an electrical data signal. In this case, the output voltage is also an electrical data signal that may be used for driving the electro-optical modulator. The output voltage carries the same information as the input voltage. The voltage swing of the output voltage is greater than the voltage swing of the input voltage. The electro-optical modulator may transform the output voltage of the driver circuit to a light signal by modulating light, e.g. laser light, wherein the light signal carries the same information as the output voltage and, thus, the input voltage. That is, the electro-optical modulator is configured to transform an electrical data signal (output voltage) to an optical data signal (laser light modulated according to the output voltage).

The low input level of the input voltage may correspond to logical low ("0") and the high input level of the input voltage may correspond to logical high ("1"). The low input level may be greater or equal to ground. The high input level may be less than or equal to the positive supply voltage level. The low input level may be smaller than half of the positive supply voltage level and the high input level may be greater than half of the positive supply voltage level. That is, the input voltage may be centered around half of the positive supply voltage level.

According to an embodiment, the low input level is equal to ground and the high input level is equal to the positive supply voltage level. According to another embodiment, the high input level is less than the positive supply voltage level. In addition, the low input level can be greater than ground.

The driver circuit may be configured to generate the output voltage such that the output voltage varies its level when the input voltage varies its level.

The driver circuit may be configured to generate the output voltage such that the output voltage is equal to the positive third level when the input voltage is equal to the low input level and that the output voltage is equal to the negative fourth level when the input voltage is equal to the high input level. The level shifter circuit may be configured to generate the first voltage such that the first voltage is equal to the positive supply voltage level when the input voltage is equal to the low input level and that the first voltage is equal to the positive first level when the input voltage is equal to the high input level. The level shifter circuit may be configured to generate the second voltage such that the second voltage is equal to ground when the input voltage is equal to the low input level and that the second voltage is equal to the negative second level when the input voltage is equal to the high input level.

Alternatively, the driver circuit may be configured to generate the output voltage such that the output voltage is equal to the positive third level when the input voltage is equal to the high input level and that the output voltage is equal to the negative fourth level when the input voltage is equal to the low input level. The level shifter circuit may be configured to generate the first voltage such that the first voltage is equal to the positive supply voltage level when the input voltage is equal to the high input level and that the first voltage is equal to the positive first level when the input voltage is equal to the low input level. The level shifter circuit may be configured to generate the second voltage such that the second voltage is equal to ground when the input voltage is equal to the high input level and that the second voltage is equal to the negative second level when the input voltage is equal to the low input level.

The level shifter may be based on CMOS technology. Additionally or alternatively, the voltage distribution circuit may be based on CMOS technology.

The positive third level may be equal to the positive supply voltage level, in the case the positive supply voltage level is less than a positive forward voltage level for forward biasing the electro-optical modulator, for example in the case the modulator electrically behaves as a diode. The positive third level may be equal to the positive supply voltage level, in the case the modulator electrically behaves like a capacitor.

Alternatively, the positive third level may be less than the positive supply voltage level, in the case the positive supply voltage level is equal to or greater than the positive forward voltage level for forward biasing the electro-optical modulator, in the case the modulator electrically behaves as a diode.

The term "voltage level" may be used as a synonym for the term "level" The terms "voltage level" and "voltage value" may be used as synonyms. Accordingly, the terms "level" and "value" may be used as synonyms.

The terms "change," "alternate," and "vary" may be used as synonyms.

The terms "connected" and "electrically connected" may be used as synonyms.

In an implementation form of the first aspect, the positive first level is equal to or less than two times the positive supply voltage level, the absolute value of the negative second level may be equal to or less than the positive supply voltage level, and/or the absolute value of the negative fourth level is equal to or less than three times the positive supply voltage level.

In case the positive first level is equal to two times the positive supply voltage level and the absolute value of the negative second level is equal to the positive supply voltage level, then the absolute value of the negative fourth level is three times the positive supply voltage level.

In an implementation form of the first aspect, the level shifter circuit comprises a level shifter up circuit and level shifter down circuit electrically connected to each other at two nodes. The level shifter up circuit comprises the first capacitor of the level shifter circuit and is configured to provide the first voltage to the voltage distribution circuit. The level shifter down circuit comprises the second capacitor of the level shifter circuit and is configured to provide the second voltage to the voltage distribution circuit.

That is, the level shifter up circuit is configured to generate the first voltage and the level shifter down circuit is configured to generate the second voltage.

The level shifter up circuit may be based on CMOS technology. Additionally or alternatively, the level shifter down circuit may be based on CMOS technology.

In an implementation form of the first aspect, the driver circuit is configured to provide on the basis of the input voltage a control voltage to a first node of the two nodes of the level shifter circuit and the inverted control voltage to the second node of the two nodes of the level shifter circuit. The control voltage varies between ground and the positive supply voltage level. The first capacitor may be connected on one side via a first n-channel metal-oxide-semiconductor field-effect transistor (first NMOS transistor) of the level shifter up circuit to the supply input and on the other side to the first node, wherein the gate terminal of the first NMOS transistor is controllable by the second node. The second capacitor may be connected on one side via a first p-channel metal-oxide-semiconductor field-effect transistor (first PMOS transistor) of the level shifter down circuit to ground and on the other side to the second node, wherein the gate terminal of the first PMOS transistor is controllable by the first node.

The term "NMOS transistor" is used herein as a synonym for the term "n-channel metal-oxide-semiconductor field-effect transistor" and the term "PMOS transistor" is used herein as a synonym for the term "p-channel metal-oxide-semiconductor field-effect transistor."

The driver circuit may comprise one or more inverters electrically connected between the input and the level shifter circuit, wherein the one or more inverters are configured to provide on the basis of the input voltage the control voltage and/or the inverted control voltage to the level shifter circuit.

In case the low input level of the input voltage corresponds to ground and the high input level of the input voltage corresponds to the positive supply voltage level, the control voltage may be equal to the input voltage and the inverted control voltage may be equal to the inverted input voltage. Alternatively, in case the low input level of the input voltage corresponds to ground and the high input level of the input voltage corresponds to the positive supply voltage level, the control voltage may be equal to the inverted input voltage and the inverted control voltage may be equal to the input voltage.

In case the low input level is greater than ground and/or the high input level is less than the positive supply voltage level, the driver circuit may comprise a plurality of inverters, wherein the inverters are configured to transform the input voltage to the control voltage and inverted control voltage. That is, the plurality of inverters is configured to provide on the basis of the input voltage the control voltage to the first node of the level shifter and the inverted control voltage to the second node of the level shifter circuit.

The driver circuit may be configured to provide the control voltage such that the control voltage is equal to ground in case the input voltage equals the low input level and the control voltage equals the positive supply voltage level in case the input voltage equals the high input level. Alternatively, the driver circuit may be configured to provide the control voltage such that the control voltage equals the positive supply voltage level in case the input voltage equals the low input level and the control voltage equals ground in case the input voltage equals the high input level.

In an implementation form of the first aspect, the level shifter up circuit comprises a third capacitor that is connected between the second node and the gate terminal of the first NMOS transistor. A third node between the third capacitor and the gate terminal of the first NMOS transistor is connected via a second NMOS transistor of the level shifter up circuit to the supply input, and the gate terminal of the second NMOS transistor is connected to a fourth node between the first NMOS transistor and the first capacitor. In addition or alternatively, the level shifter down circuit may comprise a fourth capacitor that is connected between the first node and the gate terminal of the first PMOS transistor. A fifth node between the fourth capacitor and the gate terminal of the first PMOS transistor is connected via a second PMOS transistor of the level shifter down circuit to ground, and the gate terminal of the second PMOS transistor is connected to a sixth node between the first PMOS transistor and the second capacitor.

That is, one side of the third capacitor is connected to the second node and the other side of the third capacitor is connected to the gate terminal of the first NMOS transistor and via the second NMOS transistor to the supply input. Therefore, the gate terminal of the first NMOS transistor may be connected via the third capacitor to the second node.

Accordingly, one side of the fourth capacitor is connected to the first node and the other side of the fourth capacitor is connected to the gate terminal of the first PMOS transistor and via the second PMOS transistor to ground. Therefore, the gate terminal of the first PMOS transistor may be connected via the fourth capacitor to the first node.

In an implementation form of the first aspect, the voltage distribution circuit is connected to the fourth node of the level shifter circuit between the first NMOS transistor and the first capacitor, wherein at the fourth node the level shifter up circuit is configured to provide the first voltage to the voltage distribution circuit. In addition, the voltage distribution circuit is connected to the sixth node of the level shifter circuit between the first PMOS transistor and the second capacitor, wherein at the sixth node the level shifter down circuit is configured to provide the second voltage to the voltage distribution circuit.

In an implementation form of the first aspect, the output comprises a first output terminal for providing a third voltage to the electro-optical modulator and a second output terminal for providing a fourth voltage to the electro-optical modulator. The voltage distribution circuit may comprise a first voltage distribution circuit and a second voltage distribution circuit. The first voltage distribution circuit is configured to distribute the first voltage such that at the first output terminal the third voltage is variable between ground and the positive first level. The second voltage distribution circuit is configured to distribute the second voltage such that at the second output terminal the fourth voltage is variable between the negative second level and the positive third level.

In case the electro-optical modulator electrically behaves as a diode, the third voltage may correspond to the cathode voltage and the fourth voltage may correspond to the anode voltage. The output voltage corresponds to the difference between the third voltage and fourth voltage, wherein the third voltage is subtracted from the fourth voltage. Therefore, in case the electro-optical modulator electrically behaves as a diode, the output voltage may correspond to an anode-cathode voltage (VAK) and, thus, to the difference between the cathode voltage and the anode voltage, wherein the cathode voltage is subtracted from the anode voltage.

The first voltage distribution circuit may be based on CMOS technology. Additionally or alternatively, the second voltage distribution circuit may be based on CMOS technology.

In an implementation form of the first aspect, the first voltage distribution circuit comprises a third PMOS transistor and a third NMOS transistor. The third PMOS transistor is configured to provide the first voltage to the first output terminal, in case the level of the first voltage corresponds to the positive first level. The third NMOS transistor is configured to provide a conducting path between the first output terminal and ground, in case the level of the first voltage corresponds to the positive supply voltage level.

In other words, the third PMOS transistor is configured to provide the first voltage to the first output terminal, in case the first voltage is equal to the positive first level. The third NMOS transistor is configured to provide a conducting path between the first output terminal and ground, in case the first voltage is equal to the positive supply voltage level.

That is, the third NMOS transistor is configured to pull down the first output terminal to ground, in case the first voltage is equal to the positive supply voltage level.

In an implementation form of the first aspect, the first output terminal is connected to the drain terminal of the third PMOS transistor and to the drain terminal of the third NMOS transistor. The gate terminal of the third PMOS transistor may be connected to the supply input. The level shifter circuit may be configured to control the gate terminal of the third NMOS transistor based on the input voltage. In particular, the level shifter circuit may be configured to control the gate terminal of the third NMOS transistor with the inverted control voltage.

The level shifter circuit, in particular the level shifter up circuit, may be configured to provide the first voltage to the source terminal of the third PMOS transistor of the first voltage distribution circuit. The third PMOS transistor of the first voltage distribution circuit may be connected between the fourth node of the level shifter circuit and the first output terminal. The gate terminal of the third NMOS transistor may be connected to the second node of the level shifter circuit. Thus, the gate terminal of the third NMOS transistor may be controllable by the second node of the level shifter circuit. The source terminal of the third NMOS transistor may be connected to ground.

In an implementation form of the first aspect, the second voltage distribution circuit comprises a fourth NMOS transistor and a fourth PMOS transistor. The fourth NMOS transistor is configured to provide the second voltage to the second output terminal, in case the level of the second voltage corresponds to the negative second level. The fourth PMOS transistor is configured to provide a conducting path between the second output terminal and the supply input, in case the level of the second voltage corresponds to ground.

In other words, the fourth NMOS transistor is configured to provide the second voltage to the second output terminal, in case the second voltage is equal to the negative second level. The fourth PMOS transistor is configured to provide a conducting path between the second output terminal and the supply input, in case the second voltage is equal to ground.

In an implementation form of the first aspect, the gate terminal of the fourth NMOS transistor is connected to ground. The level shifter circuit may be configured to control the gate terminal of the fourth PMOS transistor based on the input voltage. In particular, the level shifter circuit may be configured to control the gate terminal of the fourth PMOS transistor with the control voltage. According to an embodiment, the second output terminal is connected to the drain terminal of the fourth NMOS transistor and to the drain terminal of the fourth PMOS transistor. According to another embodiment, the second output terminal is connected to the drain terminal of the fourth NMOS transistor, to the source terminal of a fifth PMOS transistor of the second voltage distribution circuit and via a fifth NMOS transistor of the second voltage distribution circuit to the drain terminal of the fourth PMOS transistor, wherein the drain terminal and gate terminal of the fifth PMOS transistor are connected to ground.

The gate terminal of the fourth PMOS transistor may be connected to the first node of the level shifter circuit. Thus, the gate terminal of the third NMOS transistor may be controllable by the first node of the level shifter circuit.

The level shifter circuit may be configured to control the gate terminal of the fifth NMOS transistor with the inverted control voltage. The gate terminal of the fifth NMOS transistor may be connected to the second node of the level shifter circuit. The level shifter circuit may be configured to control the gate terminal of the fifth NMOS transistor in line with the control of the gate terminal of the third NMOS transistor of the first voltage distribution circuit.

The level shifter circuit, in particular the level shifter down circuit, may be configured to provide the second voltage to the source terminal of the fourth NMOS transistor. The fourth NMOS transistor may be connected between the sixth node of the level shifter circuit and the second output terminal.

In an implementation form of the first aspect, the fifth NMOS transistor and the fifth PMOS transistor are configured to limit the positive third level of the fourth voltage at the second output terminal below the positive forward voltage level for forward biasing the electro-optical modulator, in case the electro-optical modulator electrically behaves as a diode.

In an implementation form of the first aspect, the first voltage distribution circuit comprises a sixth NMOS transistor, wherein the drain terminal of the third NMOS transistor is connected via the sixth NMOS transistor to the first output terminal, and the gate terminal of the sixth NMOS transistor is connected to the supply input. In addition or alternatively, the second voltage distribution circuit may comprise a sixth PMOS transistor, wherein the drain terminal of the fourth PMOS transistor is connected via the sixth PMOS transistor, e.g. via the sixth PMOS transistor and the fifth NMOS transistor, to the second output terminal, and the gate terminal of the sixth PMOS transistor is connected to ground.

When the sixth NMOS transistor is connected in series with the third NMOS transistor, the stress on the third NMOS transistor is reduced, because the third voltage is split across the series connection of these two NMOS transistors. When the sixth PMOS transistor is connected in series with the fourth PMOS transistor, the stress on the fourth PMOS transistor is reduced, because the voltage between the supply input and the second output terminal is split across the series connection of these two PMOS transistors.

The drain terminal of the sixth NMOS transistor may be connected to the drain terminal of the third PMOS transistor and the first output terminal, the drain terminal of the third NMOS transistor may be connected to the source terminal of the sixth NMOS transistor, and the source terminal of the third NMOS transistor may be connected to ground. That is, the first output terminal may be connected via the cascode of the third NMOS transistor and sixth NMOS transistor to ground.

The source terminal of the sixth PMOS transistor may be connected to the drain terminal of the fourth PMOS transistor. The drain terminal of the sixth PMOS transistor may be connected to the drain terminal of the fourth NMOS transistor and the second output terminal. Alternatively, the drain terminal of the sixth PMOS transistor may be connected to the drain terminal of the fifth NMOS transistor, wherein the source terminal of the fifth NMOS transistor is connected to the drain terminal of the fourth NMOS transistor and to the second output terminal.

That is, the second output terminal may be connected via the cascode of the fourth PMOS transistor and sixth PMOS transistor to the supply input. Alternatively, the second output terminal may be connected via the fifth NMOS transistor and the cascode of the fourth PMOS transistor and sixth PMOS transistor to the supply input.

In an implementation form of the first aspect, a bulk terminal of the third PMOS transistor of the first voltage distribution circuit is connected to the source terminal of the third PMOS transistor. In addition or alternatively, a bulk terminal of the fourth NMOS transistor of the second voltage distribution circuit may be connected to the source terminal of the fourth NMOS transistor.

The third PMOS transistor of the first voltage distribution circuit may comprise an n-doped well (n-well) and the source terminal may be connected to the n-well. The fourth NMOS transistor of the second voltage distribution circuit may comprise a p-doped well (p-well) and the source terminal may be connected to the p-well. The p-doped well of the fourth NMOS transistor may be an isolated p-doped well (isolated p-well).

In case the connection of the bulk terminal of a transistor is not mentioned, it may be assumed that in case of a NMOS transistor, the p-doped well (p-well) of the NMOS transistor is connected to ground, and in case of a PMOS transistor, the n-doped well (n-well) is connected to the supply input. That is, the bulk terminal of a NMOS transistor may be connected to ground and the bulk terminal of a PMOS transistor may be connected to the supply input, in case the connection of the bulk terminal is not mentioned.

The positive supply voltage level of the DC supply voltage may be greater than the maximum value of the absolute values of the threshold voltages of the NMOS transistors and the absolute values of the threshold voltages of the PMOS transistors. In other words, the DC supply voltage is such that the driver circuit, in particular the transistors of the driver circuit, may properly function when the DC supply voltage is received by the driver circuit at the supply input.

In order to achieve the driving circuit according to the first aspect of the present disclosure, some or all of the implementation forms and optional features of the first aspect, as described above, may be combined with each other.

A second aspect of the disclosure provides a system. The system comprises the driver circuit according to the first aspect or any of its implementation forms, and a voltage controlled electro-optical modulator. The electro-optical modulator is electrically connected to the output of the driver circuit. The driver circuit is configured to drive the electro-optical modulator by providing the output voltage to the electro-optical modulator according to the input voltage.

The above description of the driver circuit according to the first aspect and any of its implementation forms is valid for the system of the second aspect, in particular for the driver circuit of the system. The above description with regard to an electro-optical modulator is valid for the voltage controlled electro-optical modulator of the system of the second aspect.

In particular, the electro-optical modulator is electrically connected to the two output terminals of the output of the driver circuit.

The electro-optical modulator may electrically behave like a diode or a capacitor.

The voltage controlled electro-optical modulator may be an electro-optical modulator with a Si p-n, III-V p-n or hybrid p-n depletion diode, such as an optical ring modulator (operating in reverse bias). In this case, the electro-optical modulator electrically behaves like a diode. Alternatively, the voltage controlled electro-optical modulator may be a metal-oxide-semiconductor capacitor based electro-optical modulator (MOSCAP electro-optical modulator) or a semiconductor-insulator-semiconductor capacitor based electro-optical modulator (SISCAP electro-optical modulator). In this case, the electro-optical modulator electrically behaves like a capacitor.

The system may correspond to an optical transmitter for transmitting optical signals based on an electrical data signal (digital signal), which may be input as the input voltage to the input of the driver circuit.

The voltage controlled electro-optical modulator may be configured to transform the output voltage of the driver circuit to a light signal by modulating light, in particular laser light, wherein the light signal carries the same information as the output voltage and, thus, the input voltage. That is, the electro-optical modulator may be configured to transform an electrical data signal (output voltage of the driver circuit) to an optical data signal (laser light modulated according to the output voltage).

The system may further comprise a laser for providing laser light that may be modulated by the voltage controlled electro-optical modulator for transmitting optical signals.

The system may comprise a single electrical supply, wherein the single electrical supply is configured to supply the DC supply voltage to the supply input of the driver circuit.

The system of the second aspect may be extended by respective implementations as described above for the driver circuit of the first aspect.

In order to achieve the system according to the second aspect of the present disclosure, some or all of the implementation forms and optional features of the second aspect, as described above, may be combined with each other.

BRIEF DESCRIPTION OF THE FIGURES

The above, as well as additional, features will be better understood through the following illustrative and non-limiting detailed description of example embodiments, with reference to the appended drawings.

In the Figures, corresponding elements are labeled with the same reference sign.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
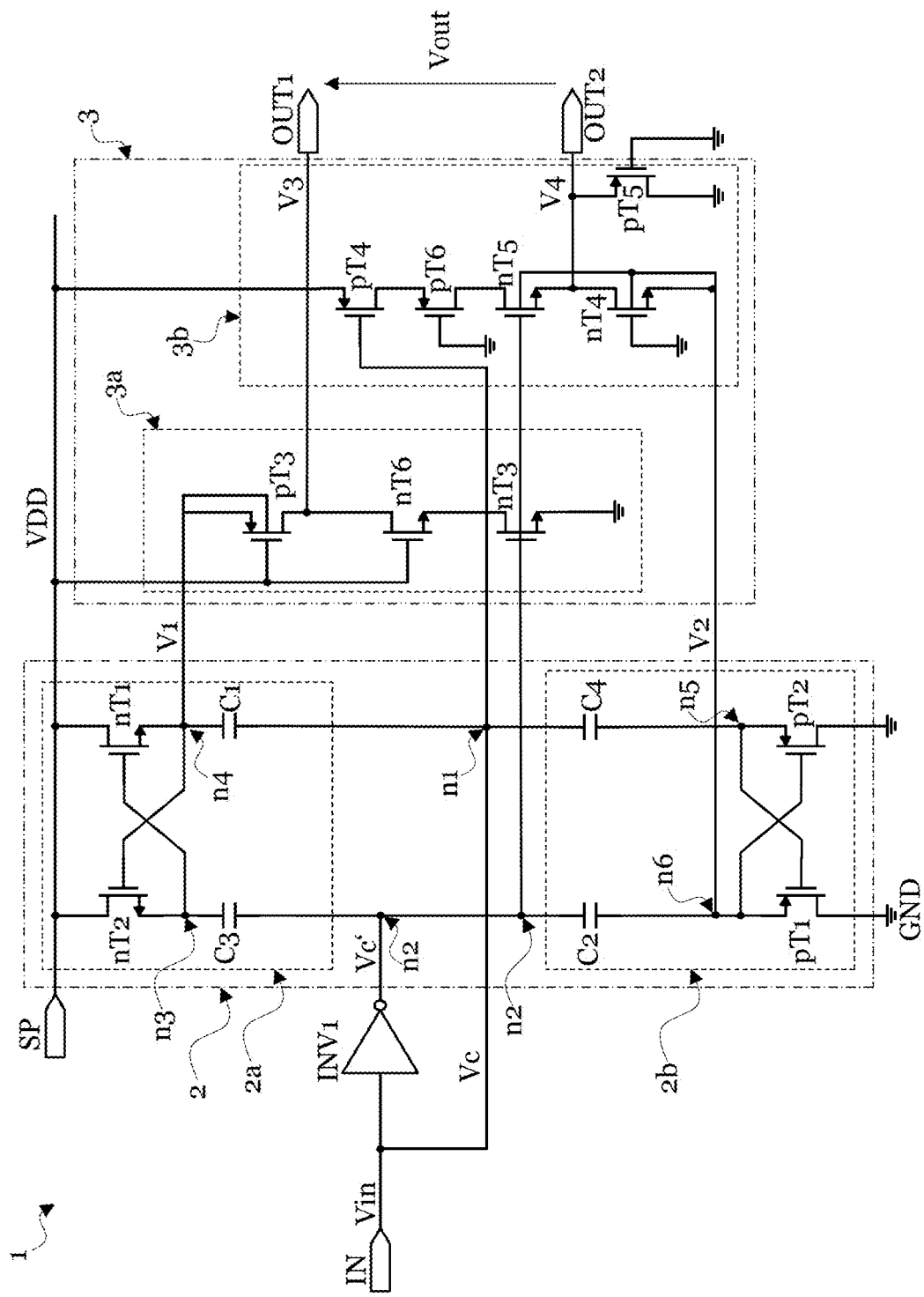
FIG. 1 shows a driver circuit according to an example.

FIG. 1 shows a driver circuit. The above description with respect to the driver circuit of the first aspect or any of its implementation forms is correspondingly valid for the driver circuit 1 of FIG. 1. Therefore, in the following description of the driver circuit 1 of FIG. 1, the same numbering is used for the elements (i.e. transistors, capacitors, voltages, and nodes) of the driver circuit 1 as is used in the above description of the driver circuit of the first aspect or any of its implementation forms. The terms "source terminal," "drain terminal," and "gate terminal" are abbreviated by the terms "source," "drain," and "gate," respectively.

As shown in FIG. 1, the driver circuit 1 comprises a supply input SP for receiving a DC supply voltage VDD and an input IN for receiving an input voltage Vin. The supply input SP is implemented by a supply input terminal and the input IN is implemented by an input terminal, as shown in FIG. 1. The driver circuit 1 comprises an output, which is formed by a first output terminal OUT1 and a second output terminal OUT2, as shown in FIG. 1. The driver circuit 1 is configured to provide an output voltage Vout at its output according to the input voltage Vin.

A voltage controlled electro-optical modulator, such as a ring modulator (RM), may be connected to the output terminals OUT1 and OUT2 (not shown in FIG. 1). The driver circuit 1 is configured to drive such a voltage controlled electro-optical modulator by providing the output voltage Vout to the electro-optical modulator according to the input voltage Vin.

From the driver circuit's 1 point of view, a voltage controlled electro-optical modulator (when connected to the output of the driver circuit 1) corresponds to a capacitance and does not generate any relevant photocurrent during operation. That is, the current flow across the output terminals OUT1 and OUT2 via the electro-optical modulator (when the modulator is connected to these output terminals) is negligible. In case the voltage controlled electro-optical modulator electrically behaves like a diode, this is true when the modulator is operated in reverse bias (i.e. in case the positive level of the output voltage Vout is less than the positive forward voltage level for forward biasing the modulator).

Further, the driver circuit 1 comprises a level shifter circuit 2 and a voltage distribution circuit 3. The level shifter circuit 2 comprises a level shifter up circuit 2a and a level shifter down circuit 2b which are connected to each other at a first node n1 and a second node n2 of the driver circuit 1, in particular of the level shifter circuit 2. The voltage distribution circuit 3 comprises a first voltage distribution circuit 3a and a second voltage distribution circuit 3b.

The driver circuit 1 comprises a first NMOS transistor nT1, a first PMOS transistor pT1, a second NMOS transistor nT2, a second PMOS transistor pT2, a third NMOS transistor nT3, a third PMOS transistor pT3, a fourth NMOS transistor nT4, a fourth PMOS transistor pT4, a fifth NMOS transistor nT5, a fifth PMOS transistor pT5, a sixth NMOS transistor nT6, a sixth PMOS transistor pT6, a first capacitor C1, a second capacitor C2, a third capacitor C3, a fourth capacitor C4 and an inverter INV1.

The transistors of the driver circuit 1 are implemented by CMOS technology, as shown in FIG. 1. Optionally, the transistors of the driver circuit 1 may be implemented by FinFET transistors, e.g. 12 nm FinFET transistors. The implementation by FinFET transistors is only by way of example and does not limit the present disclosure.

The capacitance of the first capacitor C1 and the second capacitor C2 may be greater than the capacitance to which the voltage controlled electro-optical modulator corresponds to from the point of view of the driver circuit 1 (e.g. C1, C2>> capacitance of electro-optical modulator), when the electro-optical modulator is connected to the output of the driver circuit 1 and is driven/operated by the driver circuit 1. For example, the capacitance of the first capacitor C1 may be equal to 3.5 pF and the capacitance to which the electro-optical modulator may correspond to may be equal to 50 fF. The capacitance of the first capacitor C1 and the second capacitor C2 may be implemented such that the voltage controlled electro-optical modulator, when connected to the output of the driver circuit 1 as load, does not sink a relevant fraction of charge from the capacitance, either as transient or DC current. That is, the transient current or DC current is considered to be negligible.

The third capacitor C3 is configured to restore lost charge on the first capacitor C1. The fourth capacitor C4 is configured to restore charge on the second capacitor C2.

As shown in FIG. 1, the first NMOS transistor nT1, the second NMOS transistor nT2, the first capacitor C1 and the third capacitor C3 form the level shifter up circuit 2a. The first PMOS transistor pT1, the second PMOS transistor pT2, the second capacitor C2 and the fourth capacitor C4 form the level shifter down circuit 2b.

The drain of the first NMOS transistor nT1 and of the second NMOS transistor nT2 is connected to the supply input SP. The source of the first NMOS transistor nT1 is connected to one side of the first capacitor C1, wherein the other side of the first capacitor C1 is connected to the first node n1. The source of the second NMOS transistor nT2 is connected to one side of the third capacitor C3, wherein the other side of the third capacitor C3 is connected to the second node n2. The gate of the first NMOS transistor nT1, the source of the second NMOS transistor nT2 and the third capacitor C3 are each connected to a third node n3 of the level shifter circuit 2. The gate of the second NMOS transistor nT2, the source of the first NMOS transistor nT1 and the first capacitor C1 are each connected to a fourth node n4 of the level shifter circuit 2. In case the second NMOS transistor nT2 and third capacitor C3 are not part of the driver circuit 1 (not shown in FIG. 1), the gate of the first NMOS transistor nT1 is still controllable by the second node n2, in particular by the voltage Vc' provided to the second node n2. For example, the gate of the first NMOS transistor nT1 may be connected to the second node n2.

The drain of the first PMOS transistor pT1 and of the second PMOS transistor pT2 is connected to ground GND. The source of the first PMOS transistor pT1 is connected to one side of the second capacitor C2, wherein the other side of the second capacitor C2 is connected to the second node n2. The source of the second PMOS transistor pT2 is connected to one side of the fourth capacitor C4, wherein the other side of the fourth capacitor C4 is connected to the first node nl. The gate of the first PMOS transistor pT1, the source of the second PMOS transistor pT2 and the fourth capacitor C4 are each connected to a fifth node n5 of the level shifter circuit 2. The gate of the second PMOS transistor pT2, the source of the first PMOS transistor pT1 and the second capacitor C2 are each connected to a sixth node n6 of the level shifter circuit 2. In case the second PMOS transistor pT2 and fourth capacitor C4 are not part of the driver circuit 1 (not shown in FIG. 1), the gate of the first PMOS transistor pT1 is still controllable by the first node nl, in particular by the voltage Vc provided to the first node n1. For example, the gate of the first PMOS transistor pT1 may be connected to the first node n1.

Further, as shown in FIG. 1, the third NMOS transistor nT3, the third PMOS transistor pT3 and the sixth NMOS transistor nT6 form the first voltage distribution circuit 3a. The fourth NMOS transistor nT4, the fourth PMOS transistor pT4, the fifth NMOS transistor nT5, the fifth PMOS transistor pT5, and the sixth PMOS transistor pT6 form the second voltage distribution circuit 3b.

The three transistors of the first voltage distribution circuit 3a are connected in series between the fourth node n4 of the level shifter circuit 2 and ground GND. The source of the third PMOS transistor pT3 is connected to the level shifter up circuit 2a, in particular to the fourth node n4 of the level shifter circuit 2. The drain of the third PMOS transistor pT3 is connected to the drain of the sixth NMOS transistor nT6, the source of the sixth NMOS transistor nT6 is connected to the drain of the third NMOS transistor nT3 and the source of the third NMOS transistor nT3 is connected to ground GND. The gate of the third PMOS transistor pT3 and of the sixth NMOS transistor nT6 is connected to the supply input SP and the gate of the third NMOS transistor nT3 is connected to the second node n2 of the level shifter circuit 2. The first output terminal OUT1 is connected to the drain of the third PMOS transistor pT3. In case the sixth NMOS nT6 is not part of the driver circuit 1 (not shown in FIG. 1), the drain of the third PMOS transistor pT3 is connected to the drain of the third NMOS transistor nT3.

Figure 2:
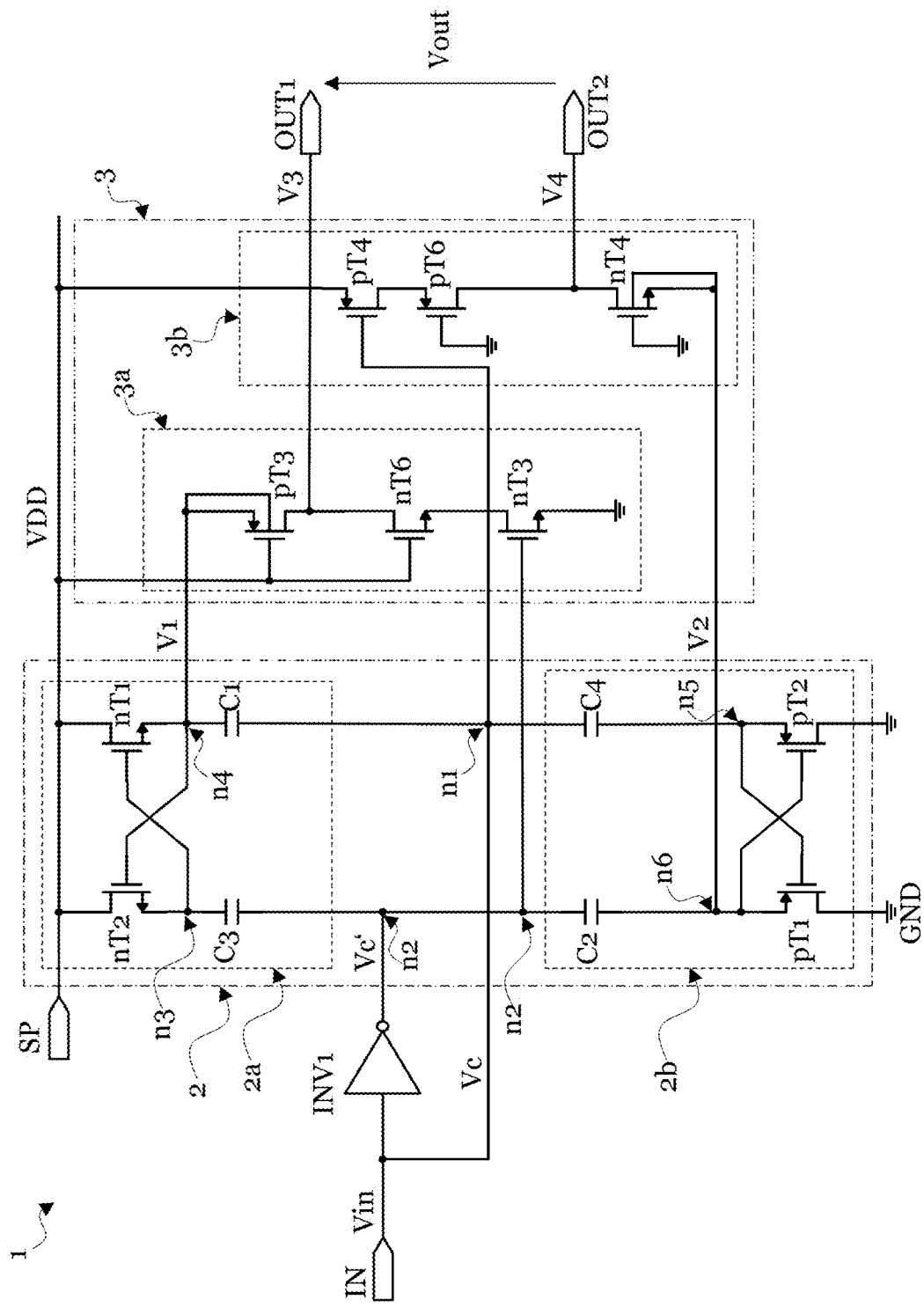
FIG. 2 shows a driver circuit according to an example.

The transistors of the second voltage distribution circuit 3b, except the fifth PMOS transistor pT5, are connected in series between the supply input SP and the sixth node n6 of the level shifter circuit 2. The source of the fourth PMOS transistor pT4 is connected to the supply input SP and the drain of the fourth PMOS transistor pT4 is connected to the source of the sixth PMOS transistor pT6. The drain of the sixth PMOS transistor pT6 is connected to the drain of the fifth NMOS transistor nT5. The source of the fifth NMOS transistor nT5 is connected to the drain of the fourth NMOS transistor nT4 and the source of the fifth PMOS transistor pT5. The source of the fourth NMOS transistor nT4 is connected to the sixth node n6 of the level shifter circuit 2. The drain of the fifth PMOS transistor pT5 is connected to ground GND. The gate of the fourth PMOS transistor pT4 is connected to the first node n1 of the level shifter circuit 2. The gate of the fifth NMOS transistor nT5 is connected to the second node n2 of the level shifter circuit 2. The gate of the fourth NMOS transistor nT4, the fifth PMOS transistor pT5 and the sixth PMOS transistor pT6 are connected to ground GND. The second output terminal OUT2 is connected to the drain of the fourth NMOS transistor nT4. In case the sixth PMOS pT6 is not part of the driver circuit 1 (not shown in FIG. 1), the drain of the fourth PMOS transistor pT4 is connected to the drain of the fifth NMOS transistor nT5. The case of the fifth NMOS transistor nT5 and fifth PMOS transistor pT5 not being part of the driver circuit 1 is shown in FIG. 2 and, thus, described below with respect to FIG. 2.

The driver circuit 1 is configured to provide based on the input voltage Vin receivable at the input IN a control voltage Vc to the first node n1 of the level shifter circuit 2 for controlling the gate of the first PMOS transistor pT1 and the fourth PMOS transistor pT4. The driver circuit 1 is further configured to provide the inverted control voltage Vc' to the second node n2 of the level shifter circuit 2 for controlling the gate of the first NMOS transistor nT1, the third NMOS transistor nT3 and the fifth NMOS transistor nT5.

As shown, in FIG. 1, the driver circuit 1 comprises an inverter INV1 that is connected between the input IN and the second node n2 of the level shifter circuit 2 for providing the inverted control voltage Vc'. The inverted control voltage may also be differently generated in any way known to the skilled person.

As shown in FIG. 1, the control voltage Vc is equal to the input voltage Vin and, thus, the inverted control voltage Vc' is equal to the inverted input voltage Vin. This is only by way of example and does not limit the present disclosure.

That is, alternatively, the control voltage Vc may be equal to the inverted input voltage Vin and the inverted control voltage Vc' may be equal to the input voltage Vin (not shown in FIG. 1). In this case, the inverter INV1 shown in FIG. 1 would not be connected between the input IN and the second node n2. Namely, in this case, the inverter INV1 would be connected between the input IN and the first node n1 of the level shifter circuit 2.

FIG. 1 shows an embodiment of the driver circuit. The input voltage Vin can vary between a low input level and high input level (not shown in FIG. 1), wherein the low input level is equal to ground and the high input level is equal to a positive supply voltage level Vdd of the supply voltage VDD receivable at the supply input SP.

In case the high input level is less than the positive supply voltage level Vdd, then additional circuitry may be provided in the driver circuit 1. This is described below with respect to FIGS. 4A and 4B.

The input voltage Vin may be a toggling voltage that toggles between the low input level and high input level. The input voltage Vin may be a data signal.

The input voltage Vin may be a digital data signal, in particular it may be a binary digital signal. For example, the input voltage may be a 20 Giga-bit-per-second (Gbps) signal. This is only by way of example and does not limit the present disclosure to a specific data rate for the input voltage.

According to an embodiment, such as the one shown in FIG. 1, the driver circuit 1 is configured to provide based on the input voltage Vin receivable at the input IN the control voltage Vc such that the control voltage Vc equals ground when the input voltage Vin equals the low input level and the control voltage Vc equals the positive supply voltage level Vdd when the input voltage Vin equals the high input level. Alternatively, the driver circuit 1 may be configured to provide based on the input voltage Vin the control voltage Vc such that the control voltage Vc equals ground when the input voltage Vin equals the high input level and the control voltage Vc equals the positive supply voltage level Vdd when the input voltage Vin equals the low input level (not shown in FIG. 1).

The voltage at the fourth node n4 (i.e. between the fourth node n4 and ground GND) is referred to as first voltage V1. The voltage at the sixth node n6 (i.e. between the sixth node n4 and ground GND) is referred to as second voltage V2. The voltage at the first output terminal OUT1 (i.e. between the first output terminal OUT1 and ground GND) is referred to as third voltage V3 and the voltage at the second output terminal OUT2 (i.e. between the second output terminal OUT2 and ground GND) is referred to as fourth voltage V4. The voltage between the first output terminal OUT1 and the second output terminal OUT2 is the output voltage Vout. As shown in FIG. 1, the output voltage Vout corresponds to the difference between the third voltage V3 and fourth voltage V4.

The function of the driver circuit 1 of FIG. 1 is described below with respect to FIG. 3, which shows voltage curves over time for the input voltage Vin, control voltage Vc, first voltage V1, second voltage V2, third voltage V3, fourth voltage V4, and output voltage Vout.

FIG. 2 shows a driver circuit according to an embodiment of the present disclosure. The driver circuit 1 of FIG. 2 corresponds to the driver circuit 1 of FIG. 1 without the fifth NMOS transistor nT5 and PMOS transistor pT5. Therefore, the above description of the driver circuit 1 of FIG. 1 is correspondingly valid for the driver circuit 1 of FIG. 2 and in the following mainly the difference between the circuits of FIGS. 1 and 2 is described.

The driver circuit 1 of FIG. 2 does not comprise the fifth NMOS transistor nT5 and PMOS transistor pT5 shown in the driver circuit 1 of FIG. 1. As a result, as shown in FIG. 2, the fourth NMOS transistor nT4, the fourth PMOS transistor pT4, and the sixth PMOS transistor pT6 form the second voltage distribution circuit 3b.

The three transistors of the second voltage distribution circuit 3b are connected in series between the supply input SP and the sixth node n6 of the level shifter circuit 2. The source of the fourth PMOS transistor pT4 is connected to the supply input SP and the drain of the fourth PMOS transistor pT4 is connected to the source of the sixth PMOS transistor pT6. The drain of the sixth PMOS transistor pT6 is connected to the drain of the fourth NMOS transistor nT4. The source of the fourth NMOS transistor nT4 is connected to the sixth node n6 of the level shifter circuit 2. The gate of the fourth PMOS transistor pT4 is connected to the first node n1 of the level shifter circuit 2. The gate of the fourth NMOS transistor nT4 and the sixth PMOS transistor pT6 is connected to ground GND. The second output terminal OUT2 is connected to the drain of the fourth NMOS transistor nT4. In case the sixth PMOS pT6 is not part of the driver circuit 1 (not shown in FIG. 2), the drain of the fourth PMOS transistor pT4 is connected to the drain of the fourth NMOS transistor nT4.

Figure 3:
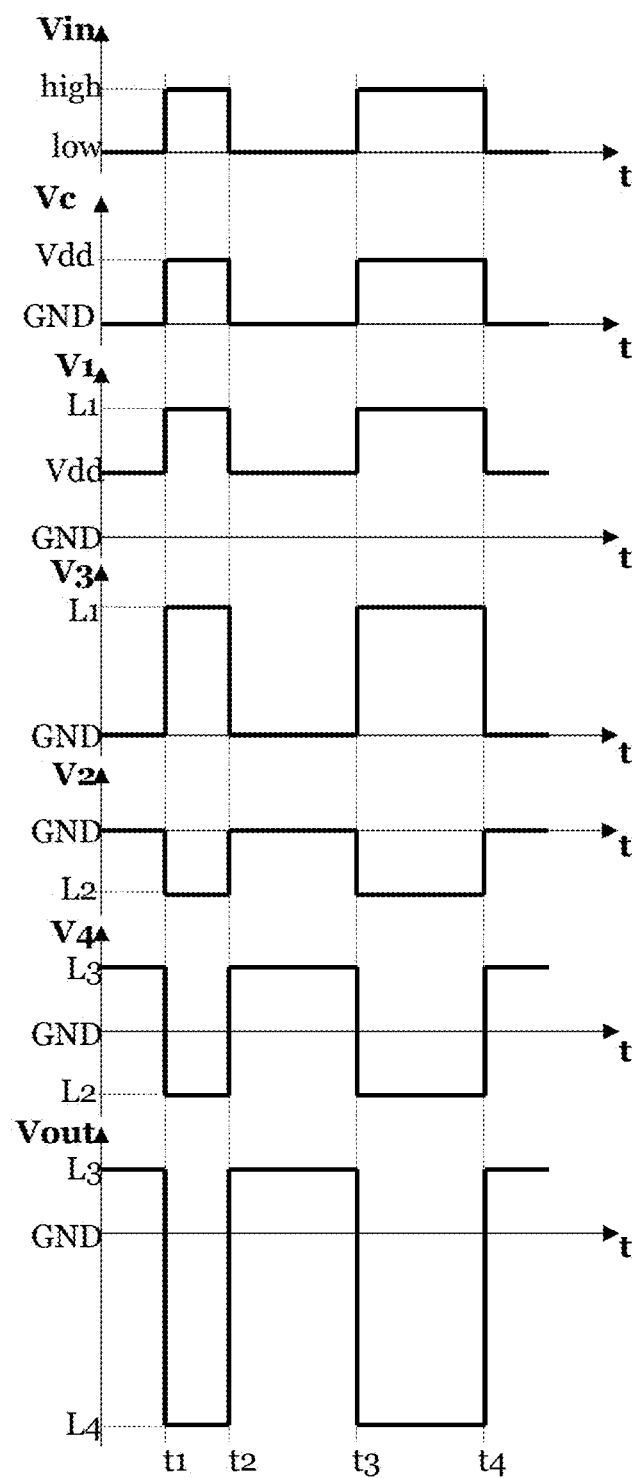
FIG. 3 shows an example of voltage curves over time for voltages at different terminals and nodes of the driver circuits of FIGS. 1 and 2.

FIG. 3 shows an example of voltage curves over time for voltages at different terminals and nodes of the driver circuits of FIGS. 1 and 2. In the following, reference is made to the elements of the driver circuits of FIGS. 1 and 2. The above description with respect to the driver circuit of the first aspect or any of its implementation forms is correspondingly valid for describing the function of the driver circuit 1 of FIGS. 1 and 2 using the voltage curves shown in FIG. 3. Therefore, in the following description, the same numbering and labeling is used for the voltages and voltage levels shown in FIG. 3 as is used in the above description of the driver circuit of the first aspect or any of its implementation forms and as is used in the above description of the driver circuit 1 of FIGS. 1 and 2.

As shown in FIG. 3, the input voltage Vin varies, in particular toggles, between the low input level "low" and the high input level "high." The control voltage Vc varies, in particular toggles, between ground GND and the positive supply voltage level Vdd of the supply voltage VDD receivable at the supply input SP. The positive supply voltage level Vdd may equal 0.8 Volt (Vdd=0.8 Volt). Ground GND may equal 0 Volt (GND=0 Volt). These values of the positive supply voltage level Vdd and ground GND are only by way of example and do not limit the present disclosure.

For the following description of the function of the driver circuits of FIGS. 1 and 2 based on the voltage curves of FIG. 3, it is assumed that the positive supply voltage level Vdd of the DC supply voltage VDD is greater than the maximum value of the absolute values of the threshold voltages of the NMOS transistors and the absolute values of the threshold voltages of the PMOS transistors of the driver circuit. That is, it is assumed that the driver circuit is supplied via the supply input with such a supply voltage VDD that allows the transistors of the driver circuit to properly function, as described below. Nevertheless, in case the positive supply voltage level Vdd is lower, the driver circuit may still operate at reduced speed due to sub-threshold conduction.

The first voltage V1 varies between the positive supply voltage level Vdd and a positive first level L1, which is greater than the positive supply voltage level Vdd (L1>Vdd). The second voltage V2 varies between a negative second level L2 and ground GND. The third voltage V3 varies between ground GND and the positive first level L1. The fourth voltage V4 varies between the negative second level L2 and a positive third level L3, which is equal to or less than the positive supply voltage level Vdd (L3<Vdd). The output voltage Vout varies between a negative fourth level L4 and the positive third level L3, wherein the absolute value of the negative fourth level L4 is greater than the positive first level L1 (|L4|>L1). In particular, the absolute value of the negative fourth level L4 equals the sum of the positive first level L1 and the absolute value of the negative second level L2 (|L4|=L1+|L2|).

According to the embodiments of FIGS. 1 and 2, the positive first level L1 is equal to two times the positive supply voltage level Vdd (L1=2·Vdd) and the absolute value of the negative second level L2 is equal to the positive supply voltage level Vdd (|L2|=Vdd or L2=−Vdd). Thus, the absolute value of the negative fourth level L4 is equal to three times the positive supply voltage level Vdd (|L4|=3·Vdd L4=3·(−Vdd)).

Alternatively, the positive first level L1 may be less than two times the positive supply voltage level Vdd (L1<2·Vdd) and/or the absolute value of the negative second level L2 may be less than the positive supply voltage level Vdd (|L2|<Vdd). In this case, the absolute value of the negative fourth level L4 is less than three times the positive supply voltage level Vdd (|L4|<3·Vdd).

The level shifter up circuit 2a, in particular the first capacitor C1, of the driver circuit 1 is configured to shift the control voltage Vc (and, thus, the input voltage Vin) to the first voltage V1 at the fourth node n4 of the level shifter circuit 2. That is, the level shifter up circuit 2a is configured to shift the voltage range between ground GND and the positive supply voltage level Vdd to the voltage range between the positive supply voltage level Vdd and the positive first level L1 (L1=2·Vdd) at the fourth node n4 of the level shifter up circuit 2. The level shifter down circuit 2b, in particular the second capacitor C2, is configured to shift the control voltage Vc (and, thus, the input voltage Vin) to the second voltage V2 at the sixth node n6 of the level shifter circuit 2. That is, the level shifter down circuit 2b is configured to shift the voltage range between ground GND and the positive supply voltage level Vdd to the voltage range between ground GND and the negative second level L2 (|L2|=Vdd or L2=−Vdd) at the sixth node n6 of the level shifter circuit 2. This results in the differential voltage (V1−V2) between the fourth node n4 and sixth node n6 of the level shifter circuit 2 to replicate the input voltage Vin or control voltage Vc, but with a voltage range between the positive supply voltage level Vdd and the sum of the positive first level L1 and the absolute value of the negative second level L2, which equals three times the positive supply voltage level Vdd (L1+|L2|=3·VDD).

The third PMOS transistor pT3 is configured to apply the positive first level L1 of the first voltage V1 to the first output terminal OUT1 and the fourth NMOS transistor nT4 is configured to apply the negative second level L2 of the second voltage V2 to the second output terminal OUT2. Because the first voltage V1 at the fourth node n4 goes above the positive supply voltage level Vdd of the supply voltage VDD (in case of V1=L1), the bulk of the third PMOS transistor pT3 that handles the fourth node n4 is not connected to the supply input SP and, thus, to the supply voltage VDD, as shown in FIGS. 1 and 2. Otherwise, this will result in a source-bulk diode forward bias. Because the second voltage V2 at the sixth node n6 goes below ground GND (in case V2=L2), the bulk of the fourth NMOS transistor nT4 that handles the sixth node n6 is not connected to ground GND, as shown in FIGS. 1 and 2. Otherwise, this will result in a source-bulk diode forward bias. To avoid this, a source bulk connection is implemented for the third PMOS transistor pT3 and the fourth NMOS transistor nT4, as shown in FIGS. 1 and 2. The n-doped well (n-well) of the third PMOS transistor pT3 is connected to the source of the third PMOS transistor pT3. The p-doped well (p-well) of the fourth NMOS transistor nT4 is connected to the source of the fourth NMOS nT4. As a result of the CMOS technology, the p-well of the fourth NMOS transistor nT4 may be an isolated p-well.

The cascode transistor, namely the sixth NMOS transistor nT6, connected in series with the third NMOS transistor nT3 may be provided to split the third voltage V3 equal to the positive first level L1 (L1=2·Vdd), over the two drain-source-voltages of these two transistors. This can prevent excessive stress over a single transistor. This occurs when the third voltage V3 at the first output voltage OUT1 is equal to the positive first level L1 and is to be discharged to ground GND by switching the third NMOS transistor nT3 and the sixth NMOS transistor nT6 to the conducting state. Accordingly, the cascode transistor, namely the sixth PMOS transistor pT6, connected in series with the fourth PMOS transistor pT4 may be provided to split a voltage that is greater than the positive supply voltage level Vdd over the two drain-source-voltages of these two transistors. The voltage corresponds to the sum of the positive supply voltage level Vdd and the absolute value of the negative second level L2 (Vdd+|L2|), which equals two times the positive supply voltage level Vdd (Vdd+|L2|=2·Vdd). This can prevent excessive stress over a single transistor. This occurs when the fourth voltage V4 at the second output voltage OUT2 is equal to the negative first level L2 and is to be charged to the positive third level L3 by switching the fourth PMOS transistor pT4, the fifth NMOS transistor nT5, and sixth PMOS transistor pT6 to the conducting state.

Thus, the sixth NMOS transistor nT6 and sixth PMOS transistor nT6 may be used for dealing with voltages generated inside the driver circuit 1 that are greater than the positive supply voltage level Vdd of the supply voltage VDD.

As shown in FIG. 3, the third voltage V3 at the first output terminal OUT1 varies, in particular toggles, between the positive first level L1 and ground GND. The fourth voltage V4 at the second output terminal OUT2 varies, in particular toggles, between the negative second level L2 and the positive third level L3.

In case the voltage controlled electro-optical modulator to be driven by the driver circuit 1 electrically behaves like a diode and, thus, is to be operated in reverse bias for modulating light, and in case the positive supply voltage level Vdd is equal to or greater than the positive forward voltage level for forward biasing the electro-optical modulator, the positive third level L3 is less than the positive supply voltage level Vdd (L3<Vdd). This is achieved by the fifth NMOS transistor nT5 and fifth PMOS transistor pT5. In particular, the fifth NMOS nT5 is configured to limit the positive third level L3 below the positive forward voltage level. The fifth PMOS transistor pT5 is configured to bias the anode branch of the voltage controlled electro-optical modulator electrical behaving like a diode (in case the modulator is connected to the output terminals OUT1 and OUT2) when the fourth NMOS transistor nT4 is in the non-conducting state. Thus, the fifth PMOS transistor pT5 is configured to fix the maximum voltage at the second output terminal OUT2. In other words, the fifth NMOS transistor nT5 and the fifth PMOS transistor pT5 are configured to limit the positive third level L3 of the fourth voltage V4 at the second output terminal OUT2 below the positive forward voltage level for forward biasing the electro-optical modulator, in case the electro-optical modulator electrically behaves as a diode.

In case the positive supply voltage level Vdd is less than the positive forward voltage level for forward biasing the electro-optical modulator or in case the electro-optical modulator does not electrically behave as a diode but as a capacitor, the positive third level L3 may be equal to the positive supply voltage level Vdd (L3=Vdd). In this case, the fifth NMOS transistor nT5 and fifth PMOS transistor pT5 may be omitted from the driver circuit 1, as it is the case in the driver circuit of FIG. 2.

The term "on-state" may be used as a synonym for the term "conducting state" and the term "off-state" may be used as a synonym for the term "non-conducting state."

As shown in FIG. 3, until the time t1, during the period between the time t2 and t3 and after the time t4, the input voltage Vin corresponds to the low input level (Vin=low) and the control voltage Vc corresponds to ground GND (Vc=GND). Therefore, the voltage at the first node n1 of the level shifter circuit 2, to which the control voltage Vc is applied, is equal to ground GND and the voltage at the second node n2 of the level shifter circuit 2, to which the inverted control voltage Vc' is applied, is equal to the positive supply voltage level Vdd. As a result, the first NMOS transistor nT1 and first PMOS transistor pT1 of the level shifter circuit 2 are switched to the conducting state and the second NMOS transistor nT2 and second PMOS transistor pT2 of the level shifter circuit 2 are switched to the non-conducting state. Therefore, the first voltage V1 at the fourth node n4 corresponds to the positive supply voltage level Vdd (V1=Vdd) and the second voltage V2 at the sixth node n6 corresponds to ground GND (V2=GND). With respect to the first voltage distribution circuit 3a, the third PMOS transistor pT3 is switched to the non-conducting state and the third NMOS transistor nT3 and the sixth NMOS transistor nT6 are switched to the conducting-state. Therefore, the third voltage V3 at the first output terminal OUT1 is equal to ground GND (V3=GND). With respect to the second voltage distribution circuit 3b, the fourth PMOS transistor pT4, fifth NMOS transistor nT5, fifth PMOS transistor pT5 and sixth PMOS transistor pT6 are switched to the conducting state and the fourth NMOS transistor nT4 is switched to the non-conducting state. Therefore, the fourth voltage V4 at the second output terminal OUT2 is equal to the positive third level L3 (V4=L3) that is less than the positive supply voltage level Vdd (L3<Vdd). In case the fifth NMOS transistor nT5 and fifth PMOS transistor pT5 are not part of the driver circuit 1, the positive voltage level L3 is equal to the positive supply voltage level Vdd (L3=Vdd). The output voltage Vout, which is the difference of the third voltage V3 and fourth voltage V4, is equal to the positive third level L3, as shown in FIG. 3.

As shown in FIG. 3, during the period between the time t1 and t2 and the period between the time t3 and t4, the input voltage Vin corresponds to the high input level (Vin=high) and the control voltage Vc corresponds to the positive supply voltage level Vdd (Vc=Vdd). Therefore, the voltage at the first node n1 of the level shifter circuit 2, to which the control voltage Vc is applied, is equal to the positive supply voltage level Vdd and the voltage at the second node n2 of the level shifter circuit 2, to which the inverted control voltage Vc' is applied, is equal to ground GND. As a result, the first NMOS transistor nT1 and first PMOS transistor pT1 of the level shifter circuit 2 are switched to the non-conducting state and the second NMOS transistor nT2 and second PMOS transistor pT2 of the level shifter circuit 2 are switched to the conducting state. Therefore, the first voltage V1 at the fourth node n4 corresponds to the positive first level L1 (V1=L1=2·Vdd) and the second voltage V2 at the sixth node corresponds to the negative second level L2 (V2=L2=−Vdd, |L2|=Vdd). With respect to the first voltage distribution circuit 3a, the third PMOS transistor pT3 is switched to the conducting state and the third NMOS transistor nT3 and the sixth NMOS transistor nT6 are switched to the non-conducting-state. Therefore, the third voltage V3 at the first output terminal OUT1 is equal to the positive first level (V3=L1). With respect to the second voltage distribution circuit 3b, the fourth PMOS transistor pT4, fifth NMOS transistor nT5, fifth PMOS transistor pT5 and sixth PMOS transistor pT6 are switched to the non-conducting state and the fourth NMOS transistor nT4 is switched to the conducting state. Therefore, the fourth voltage V4 at the second output terminal OUT2 is equal to the negative second level L2 (V4=L2). The output voltage Vout, which is the difference of the third voltage V3 and fourth voltage V4, is equal to the negative fourth level L4, as shown in FIG. 3. The absolute value of the negative fourth level L4 is equal to the sum of the positive first level L1 and the absolute value of the negative second level L2 (|L4=L1+|L1|+|L2| or L4=L2−L1). Thus, in the case of the embodiments of FIGS. 1 and 2, the absolute value of the negative fourth level L4 is equal to three times the positive supply voltage level Vdd (|V4|=3·Vdd).

In light of the above, the driver circuit 1, in particular the level shifter circuit 2 and the voltage distribution circuit 3, are configured to shift the input voltage Vin that may toggle between ground GND and the positive supply voltage level Vdd to the output voltage Vout toggling between the negative fourth level L4 and the positive third level L3. Thus, the driver circuit 1 is configured to increase the voltage swing of the input voltage Vin, which is at maximum the positive supply voltage level Vdd, to a greater voltage swing of the output voltage Vout, which may be four times the positive supply voltage level Vdd (4·Vdd). This is the case when the first level L1 is equal to two times the positive supply voltage level Vdd (L1=2VDD), the absolute value of the negative second level L2 is equal to the positive supply voltage level Vdd (|L2|=VDD) and the positive third level L3 is equal to the positive supply voltage level Vdd (L3=VDD).

As shown in FIG. 3, the levels of the output voltage Vout are inverted with respect to the levels of the input voltage. That is, the lower level (low input level "low") of the two levels of the input voltage Vin is transformed to the higher level (positive third level L3) of the two levels of the output voltage Vout. The higher level (high input level "high") of the two levels of the input voltage Vin is transformed to the lower level (negative third level L4) of the two levels of the output voltage Vout.

Alternatively to the voltage curves shown in FIG. 3, the driver circuit may also be configured to generate a control voltage Vc that is inverted with respect to the input voltage Vin (not shown in FIGS. 1 and 2). That is, in case the input voltage Vin equals the low input level (Vin=low) the control voltage Vc may equal the positive supply voltage level Vdd (Vc=Vdd) and in case the input voltage Vin equals the high input level (Vin=high) the control voltage Vc may equal ground GND (Vc=GND). As a result, the voltage curves of the control voltage Vc, first voltage V1, second voltage V2, third voltage V3, fourth voltage V4 and output voltage Vout would be inverted with respect to the corresponding curves shown in FIG. 3 for the voltage curve of the input voltage Vin shown in FIG. 3. That is, in such a case the first voltage V1 equals the positive first level L1 (V1=L1), the second voltage V2 equals the negative second level L2 (V2=L2), the third voltage V3 equals the positive first level L1 (V3=L1), the fourth voltage V4 equals the negative second level L2 (V4=L2) and the output voltage Vout equals the negative fourth level L4 (Vout=L4), when the input voltage Vin equals the low input level (Vin=low) and, thus, the control voltage Vc equals the positive supply voltage level Vdd (Vc=Vdd). Accordingly, in such a case, the first voltage V1 equals the positive supply voltage level (V1=Vdd), the second voltage V2 equals ground GND (V2=GND), the third voltage V3 equals ground GND (V3=GND), the fourth voltage V4 equals the positive third level L3 (V4=L3) and the output voltage Vout equals the positive third level L3 (Vout=L3), when the input voltage Vin equals the high input level (Vin=high) and, thus, the control voltage Vc equals ground GND (Vc=GND).

Figure 4A:
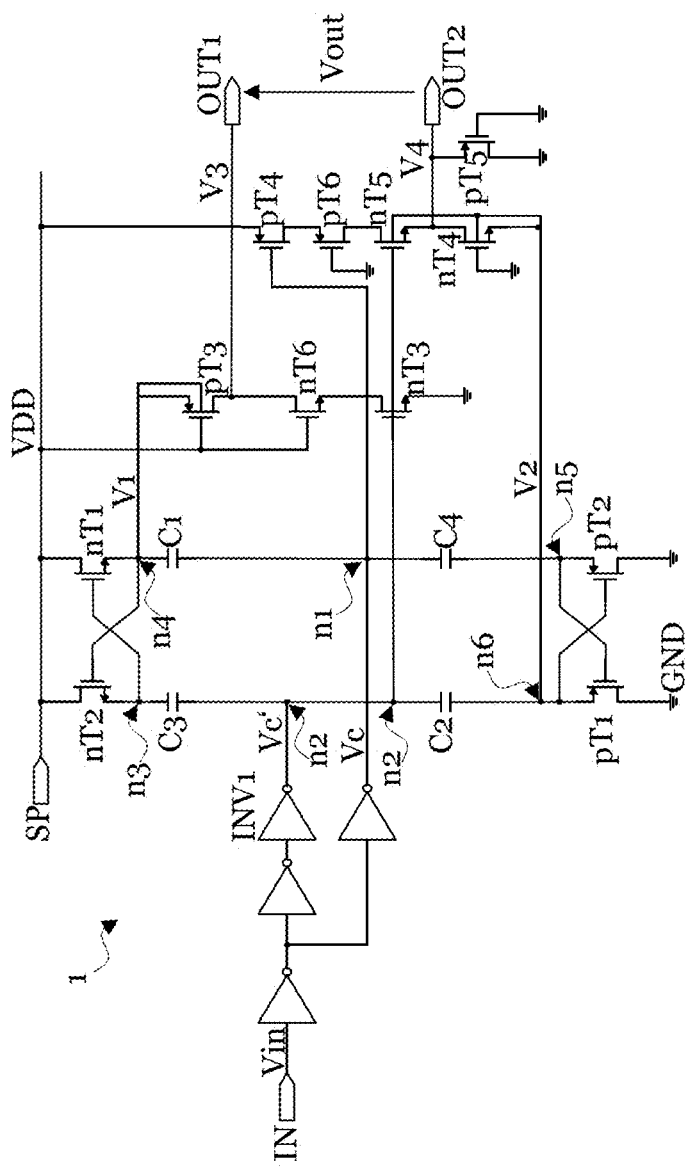
FIG. 4A shows a driver circuit according to an example.
Figure 4B:
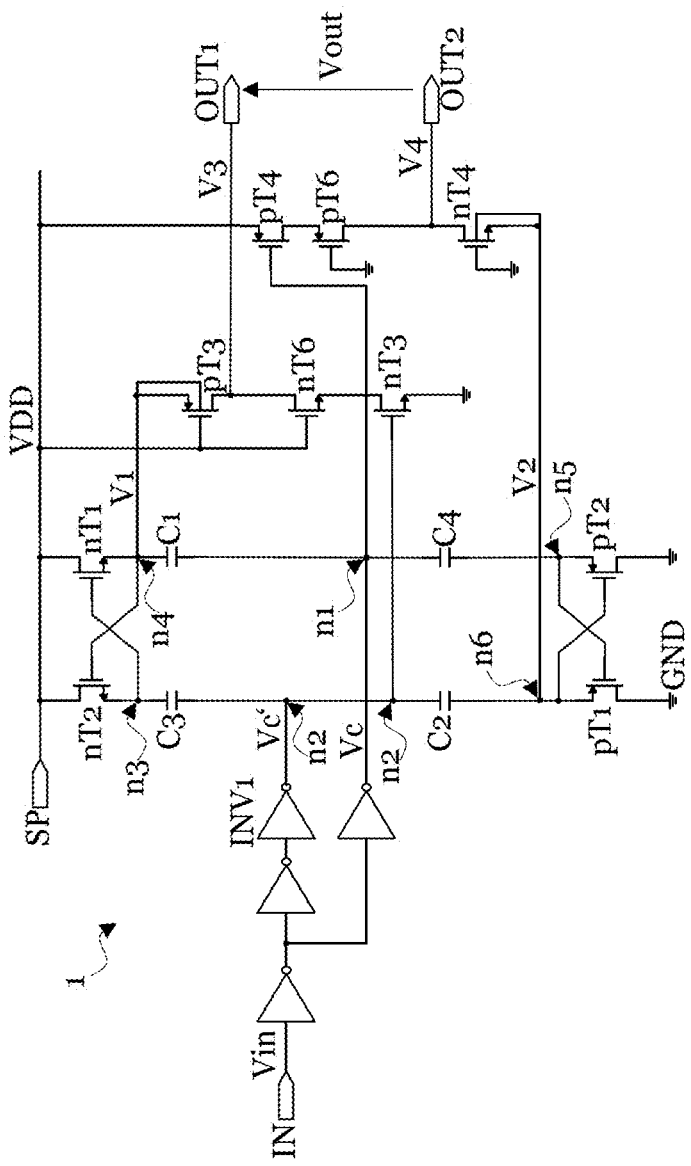
FIG. 4B shows a driver circuit according to an example.

FIGS. 4A and 4B each show a driver circuit according to an embodiment of the present disclosure.

The driver circuit 1 of FIG. 4A corresponds to the driver circuit 1 of FIG. 1 with additional inverters connected between the input IN and the first node n1 and second node n2 of the level shifter circuit 2. Therefore, the above description of the driver circuit 1 of FIG. 1 is correspondingly valid for the driver circuit 1 of FIG. 4A and the above description with respect to FIG. 3 is correspondingly valid for describing the function of the driver circuit 1 of FIG. 4A. In the following, mainly the difference between the circuits of FIGS. 1 and 4A is described.

As shown in FIG. 4A, the driver circuit 1 comprises additional inverters besides the inverter INV1 that are connected between the input IN and the level shifter circuit 2. That is, the driver circuit 1 comprises a plurality of inverters connected between the input IN and the level shifter circuit 2. In particular, two inverters are connected between the input IN and the first node n1 of the level shifter circuit 2 for providing the control voltage Vc to the first node n1. Three inverters are connected between the input IN and the second node n2 of the level shifter circuit 2 for providing the inverted control voltage Vc' to the second node n2. The number of inverters, namely four inverters, shown in FIG. 4A is only by way of example and may be greater than four, as long as the control voltage Vc is provided to the first node n1 and the inverted control voltage Vc' is provided to the second node n2.

The plurality of inverters is configured to provide based on the input voltage Vin the control voltage Vc to the first node n1 and the inverted control voltage Vc' to the second node of the level shifter circuit 2. In particular, the inverters connected between the input IN and the first node n1 are configured to transform the low input level of the input voltage Vin to ground GND and the high input level of the input voltage Vin to the positive supply voltage level Vdd for generating the control voltage Vc at the first node n1. For achieving this, an even number of inverters is connected between the input IN and the first node n1, as shown in FIG. 4A. The inverters connected between the input IN and the second node n2 are configured to transform the low input level of the input voltage Vin to the positive supply voltage level Vdd and the high input level to ground GND for generating the inverted control voltage Vc' at the second node n2. For achieving this, an odd number of inverters is connected between the input IN and the first node n1, as shown in FIG. 4A.

Alternatively, the inverters connected between the input IN and the first node n1 may be configured to transform the high input level of the input voltage Vin to ground GND and the low input level of the input voltage Vin to the positive supply voltage level Vdd for generating the control voltage Vc at the first node n1 (not shown in FIG. 4A). For achieving this, an odd number of inverters may be connected between the input IN and the first node n1 (not shown in FIG. 4A). The inverters connected between the input IN and the second node n2 may be configured to transform the high input level of the input voltage Vin to the positive supply voltage level Vdd and the low input level to ground GND for generating the inverted control voltage Vc' at the second node n2 (not shown in FIG. 4A). For achieving this, an even number of inverters may be connected between the input IN and the first node n2 (not shown in FIG. 4A).

FIG. 4A shows an embodiment for the case that the high input level of the input voltage Vin is less than the positive supply voltage level Vdd. In such a case, inverters may be used to generate based on the input voltage Vin the control voltage Vc that varies between ground GND and the positive supply voltage level Vdd. In other words, the input voltage Vin may be buffered by a chain of inverters to achieve a voltage swing between ground GND and the positive supply voltage level Vdd of the control voltage Vc (with sharp transitions).

The driver circuit 1 of FIG. 4B corresponds to the driver circuit 1 of FIG. 4a. The difference between the circuits of FIGS. 4A and 4B is that the driver circuit 1 of FIG. 4B does not comprise the fifth NMOS transistor nT5 and fifth PMOS transistor pT5. With regard to this difference, the driver circuit 1 of FIG. 4B corresponds to the driver circuit 1 of FIG. 2. Therefore, the above description of the driver circuit 1 of FIG. 4a as well as the above description of the driver circuit 1 of FIG. 2 is correspondingly valid for the driver circuit 1 of FIG. 4B.

Figure 5A:
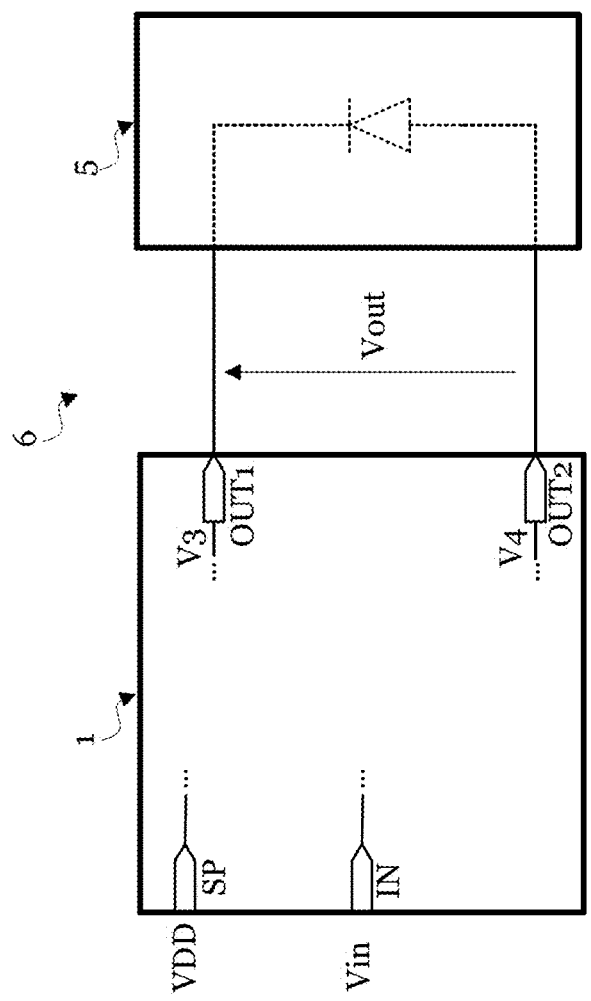
FIG. 5A shows a system according to an example.
Figure 5B:
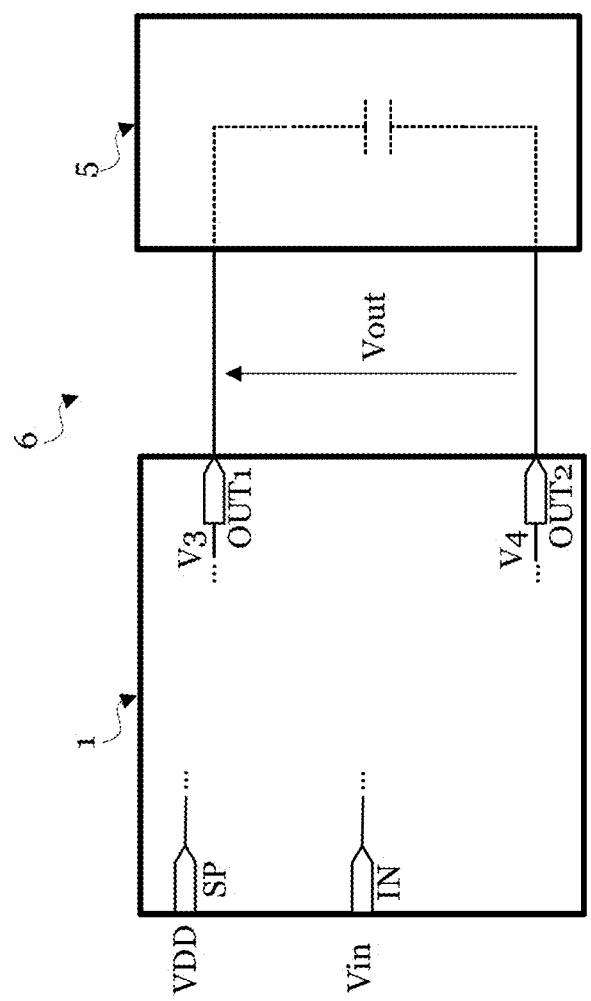
FIG. 5B shows a system according to an example.
Figure 6:
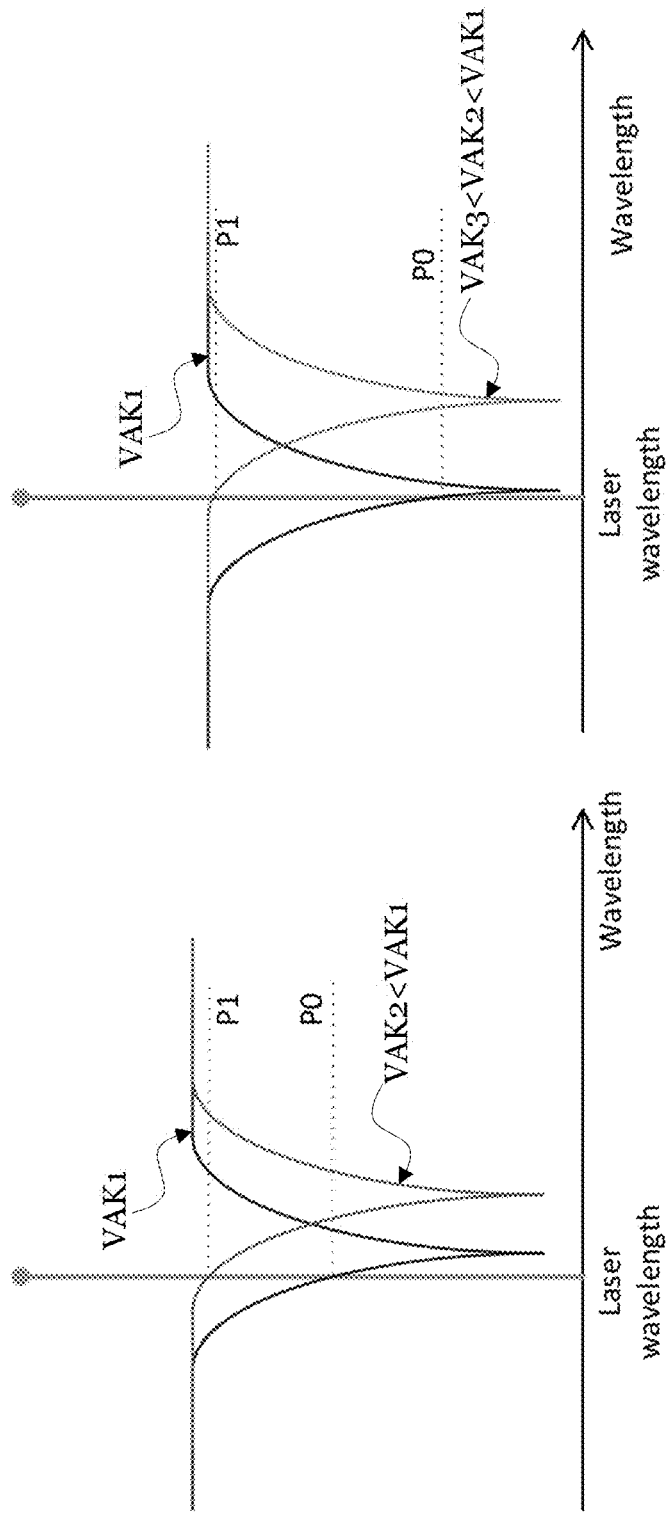
FIG. 6 shows the response of a ring modulator (RM) for three different anode-cathode voltage (VAK) values VAK1, VAK2, and VAK3 applied to the RM, according to an example.

FIGS. 5A and 5B each show a system according to an embodiment of the present disclosure.

FIG. 5A shows a system 6 comprising a driver circuit 1 according to the first aspect or any of its implementation forms and a voltage controlled electro-optical modulator 5. The above description with regard to the driver circuit 1 of the first aspect or any of its implementation forms is valid for the system 6, in particular for the driver circuit 1 of the system 6. The above description with regard to the system of the second aspect or any of its implementation forms is correspondingly valid for the system 6.

The driver circuit 1 may be any one of the driver circuits according to FIGS. 1, 2, 4A, and 4B. Thus, the above description with regard to FIGS. 1, 2, 3, 4A, and 4B is correspondingly valid for the system 6, in particular for the driver circuit 1 of the system 6.

As shown in FIG. 5A, the electro-optical modulator 5 is connected to the output, in particular to the output terminals OUT1 and OUT2, of the driver circuit 1. The driver circuit 1 is configured to drive the electro-optical modulator 5 by providing the output voltage Vout at the output according to the input voltage Vin that may be input to the input IN of the driver circuit 1. As a result, the electro-optical modulator 5 is configured to modulate light, such as laser light, according to the input voltage. The input voltage Vin may be a digital data signal, for example a binary data signal. Therefore, the driver circuit 1 is configured to drive the voltage controlled electro-optical modulator 5 such that the electro-optical modulator 5 transforms the electrical data signal Vin to an optical signal by modulating light, such as laser light.

The system 6 may also be referred to as a transmitter that is configured to optically transmit information that is input to the transmitter, in particular to the input IN of the driver circuit 1, as an electrical digital data signal Vin.

The system 6 may comprise a light source, such as a laser, that is configured to provide light to the electro-optical modulator 5 to be modulated by the electro-optical modulator 5 (not shown in FIG. 5A).

As indicated in FIG. 5A, the voltage controlled electro-optical modulator 5 may correspond to a voltage controlled electro-optical modulator that electrically behaves like a diode, such as a ring modulator (RM). Examples of such a modulator are an electro-optical modulator with a Si p-n, III-V p-n, or hybrid p-n depletion diode. In this case, the output voltage Vout corresponds to the anode-cathode voltage (VAK) and, thus, the third voltage V3 at the first output terminal OUT1 corresponds to the cathode voltage and the fourth voltage V4 at the second output terminal OUT2 corresponds to the anode voltage. As described already above, a voltage controlled electro-optical modulator electrically behaving as a diode is operated in reverse bias for modulating light, such as laser light. Therefore, in this case, the driver circuit 1 is configured to provide the output voltage Vout such that the positive level of the output voltage Vout (i.e. the positive third level) is limited below the positive forward voltage level for forward biasing the electro-optical modulator 5.

Alternatively, the voltage controlled electro-optical modulator 5 may behave electrically as a capacitor. This case is indicated in FIG. 5B. Examples of such a modulator are a metal-oxide-semiconductor capacitor based electro-optical modulator (MOSCAP electro-optical modulator) or a semiconductor-insulator-semiconductor capacitor based electro-optical modulator (SISCAP electro-optical modulator).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:
1. A driver circuit comprising:
   a level shifter circuit configured to:
      generate, based on an input voltage, a first voltage varying between a positive supply voltage level and a positive first level that is greater than the positive supply voltage level, and
      generate, based on the input voltage, a second voltage varying between a ground and a negative second level; and
   a voltage distribution circuit configured to generate an output voltage that is variable between a positive third level that is equal to or less than the positive supply voltage level and a negative fourth level, wherein an absolute value of the negative fourth level is greater than an absolute value of the positive first level.

2. The driver circuit of claim 1, wherein the level shifter circuit comprises a capacitor configured to generate the first voltage.

3. The driver circuit of claim 2, wherein the level shifter circuit comprises a second capacitor configured to generate the second voltage.

4. The driver circuit according to claim 1, wherein the positive first level is equal to or less than two times the positive supply voltage level.

5. The driver circuit according to claim 1, wherein an absolute value of the negative second level is equal to or less than the positive supply voltage level.

6. The driver circuit according to claim 1, wherein an absolute value of the negative fourth level is equal to or less than three times the positive supply voltage level.

7. The driver circuit according to claim 1, wherein
the level shifter circuit comprises a level shifter up circuit and a level shifter down circuit electrically connected to each other at a first node and a second node;
the level shifter up circuit comprises a first capacitor and is configured to provide the first voltage to the voltage distribution circuit; and
the level shifter down circuit comprises a second capacitor and is configured to provide the second voltage to the voltage distribution circuit.

8. The driver circuit according to claim 7, wherein
the driver circuit is configured to provide based on the input voltage a control voltage to the first node and an inverted control voltage to the second node, wherein the control voltage varies between the ground and the positive supply voltage level;
the first capacitor is connected via a first NMOS transistor to the positive supply voltage level and is connected to the first node, wherein a gate terminal of the first NMOS transistor is controllable by the second node;
the second capacitor is connected via a first PMOS transistor to the ground and connected to the second node, wherein a first gate terminal of the first PMOS transistor is controllable by the first node.

9. The driver circuit according to claim 8, wherein
the level shifter up circuit comprises a third capacitor that is connected between the second node and the gate terminal of the first NMOS transistor,
a third node between the third capacitor and the gate terminal of the first NMOS transistor is connected via a second NMOS transistor to the positive supply voltage level,
the gate terminal of the second NMOS transistor is connected to a fourth node between the first NMOS transistor and the first capacitor;
the level shifter down circuit comprises a fourth capacitor that is connected between the first node and the gate terminal of the first PMOS transistor,
a fifth node between the fourth capacitor and the gate terminal of the first PMOS transistor is connected via a second PMOS transistor of the level shifter down circuit to ground, and
the gate terminal of the second PMOS transistor is connected to a sixth node between the first PMOS transistor and the second capacitor.

10. The driver circuit according to claim 9, wherein the voltage distribution circuit is connected to:
the fourth node between the first NMOS transistor and the first capacitor, wherein at the fourth node the level shifter up circuit is configured to provide the first voltage to the voltage distribution circuit, and
the sixth node between the first PMOS transistor and the second capacitor, wherein at the sixth node the level shifter down circuit is configured to provide the second voltage to the voltage distribution circuit.

11. The driver circuit according to claim 1, wherein
the voltage distribution circuit comprises a first voltage distribution circuit and a second voltage distribution circuit;
the first voltage distribution circuit is configured to distribute the first voltage such that at a first output terminal a third voltage is variable between ground and the positive first level; and
the second voltage distribution circuit is configured to distribute the second voltage such that at a second output terminal a fourth voltage is variable between the negative second level and the positive third level.

12. The driver circuit according to claim 11, wherein
the first voltage distribution circuit comprises a third PMOS transistor and a third NMOS transistor;
the third PMOS transistor is configured to provide the first voltage to the first output terminal; and
the third NMOS transistor is configured to provide a conducting path between the first output terminal and the ground, in case the first voltage corresponds to the positive supply voltage level.

13. The driver circuit according to claim 12, wherein
the first output terminal is connected to a drain terminal of the third PMOS transistor and to a third drain terminal of the third NMOS transistor;
a gate terminal of the third PMOS transistor is connected to a supply input; and
the level shifter circuit is configured to control the gate terminal of the third NMOS transistor based on the input voltage.

14. The driver circuit according to claim 11, wherein
the second voltage distribution circuit comprises a fourth NMOS transistor and a fourth PMOS transistor;
the fourth NMOS transistor is configured to provide the second voltage to the second output terminal; and
the fourth PMOS transistor is configured to provide a conducting path between the second output terminal and a supply input.

15. The driver circuit according to claim 14,
wherein a gate terminal of the fourth NMOS transistor is connected to ground; and
the level shifter circuit is configured to control the gate terminal of the fourth PMOS transistor based on the input voltage, and
wherein
the second output terminal is connected to a drain terminal of the fourth NMOS transistor and to the drain terminal of the fourth PMOS transistor, or
the second output terminal is connected to the drain terminal of the fourth NMOS transistor, to a source terminal of a fifth PMOS transistor of the second voltage distribution circuit and via a fifth NMOS transistor of the second voltage distribution circuit to the drain terminal of the fourth PMOS transistor, wherein the drain terminal and gate terminal of the fifth PMOS transistor are connected to the ground.

16. The driver circuit according to claim 12,
wherein
the first voltage distribution circuit comprises a sixth NMOS transistor,
a third drain terminal of the third NMOS transistor is connected via the sixth NMOS transistor to the first output terminal, and a sixth gate terminal of the sixth NMOS transistor is connected to a supply input; and/or wherein the second voltage distribution circuit comprises a sixth PMOS transistor, a fourth drain terminal of a fourth PMOS transistor is connected via the sixth PMOS transistor, optionally via the sixth PMOS transistor and a fifth NMOS transistor, to the second output terminal, and the sixth gate terminal of the sixth PMOS transistor is connected to ground.

17. The driver circuit according to claim 12, wherein a third bulk terminal of the third PMOS transistor of the first voltage distribution circuit is connected to a source terminal of the third PMOS transistor; and/or a fourth bulk terminal of a fourth NMOS transistor of the second voltage distribution circuit is connected to the source terminal of the fourth NMOS transistor.

18. A system comprising:

the driver circuit according to claim 1, and an electro-optical modulator; wherein the electro-optical modulator is electrically connected to an output of the driver circuit, and the driver circuit is configured to drive the electro-optical modulator by providing the output voltage to the electro-optical modulator according to the input voltage.

19. The system according to claim 18, wherein an NMOS transistor and a PMOS transistor are configured to limit the positive third level of a fourth voltage at a second output terminal below a positive forward voltage level for forward biasing the electro-optical modulator.

20. A method comprising:

receiving a positive supply voltage and an input voltage;

generating, based on the input voltage, a first voltage that varies between the positive supply voltage and a positive first level that is greater than the positive supply voltage;

generating, based on the input voltage, a second voltage that varies between a ground and a negative second level; and generating an output voltage that is variable between a positive third level that is equal to or less than the positive supply voltage and a negative fourth level, wherein an absolute value of the negative fourth level is greater than an absolute value of the positive first level.

* * * * *